United States Patent
Miyake et al.

(10) Patent No.: US 7,345,140 B2
(45) Date of Patent: Mar. 18, 2008

(54) PHENOL-REACTED NON-ESTER ALICYCLIC DIEPOXIDES

(75) Inventors: Hiroto Miyake, Ohtake (JP); Atsushi Sato, Iwakuni (JP)

(73) Assignee: Daicel Chemical Industries, Ltd., Sakai-Shi (JP)

( * ) Notice: Subject to any disclaimer, the term of this patent is extended or adjusted under 35 U.S.C. 154(b) by 404 days.

(21) Appl. No.: 11/037,249

(22) Filed: Jan. 19, 2005

(65) Prior Publication Data

US 2005/0215749 A1 Sep. 29, 2005

(30) Foreign Application Priority Data

Jan. 21, 2004 (JP) ............... 2004-13660

(51) Int. Cl.
*C08G 59/24* (2006.01)
*C08L 63/00* (2006.01)

(52) U.S. Cl. .................. 528/406; 525/523; 525/524; 525/529; 525/531

(58) Field of Classification Search ............ None
See application file for complete search history.

(56) References Cited

U.S. PATENT DOCUMENTS 3,547,872 A * 12/1970 Weissermel et al. ....... 523/440
6,160,077 A * 12/2000 Bayer et al. ............... 528/93
2006/0009547 A1* 1/2006 Maeshima et al. ......... 523/427

FOREIGN PATENT DOCUMENTS

GB 1005732 A * 9/1965
JP 11-263827 A 9/1999

OTHER PUBLICATIONS

HCAPLUS accession No. 1982:218684 for the Plasticheskie Massy article by Pet'ko et al., vol. 4, 1982, abstract, two pages.*
HCAPLUS accession No. 1982:492044 for the Deposited Doc. article by Batog et al., 1980, three pages.*
HCAPLUS accession No. 1994:193852 and Derwent accession No. 1993-301471 for Soviet Union Patent No. 1,763,455, Onishchenko et al., Sep. 23, 1992, three pages.*
Derwent accession No. 2004-399859 for U.S. Publication No. 2006/0009547, Maeshima et al., Jan. 12, 2006, equivalent to PCT Publication No. WO 2004/035558 A1, Apr. 29, 2004, one page.*
Cover sheet for PCT Publication No. WO 2004/035558 A1, Maeshima et al., Apr. 29, 2004 of PCT Application No. PCT/JP2003/011287, Sep. 4, 2003, one page.*

* cited by examiner

*Primary Examiner*—Robert Sellers
(74) *Attorney, Agent, or Firm*—Birch, Stewart, Kolasch & Birch, LLP

(57) ABSTRACT

The present invention provides a non-ester type epoxy resin having a low hydrolytic chlorine content and containing no ester bond that is easily hydrolyzed, and a resin composition containing the non-ester type epoxy resin as an essential ingredient. Using the non-ester type epoxy resin, a resin composition having a low chlorine content and also having low water absorption and acid value is obtained. The resin composition is useful as a curable resin composition for a material in an electronics.

7 Claims, No Drawings

PHENOL-REACTED NON-ESTER ALICYCLIC DIEPOXIDES

BACKGROUND OF THE INVENTION

1. Field of the Invention

The present invention relates to a non-ester type epoxy resin containing no ester bonds a resin composition containing the resin, and use of the resin composition.

2. Description of the Related Art

In recent years, rapid curing of epoxy resins at low temperatures has been desired. For instance, photo-cationic curing using a photo acid generator has been studied. In general, a glycidyl ether type epoxy resin has a low reaction rate and an epoxy group thereof also has low reactivity. Thus, there arises a problem in that the glycidyl ether type epoxy resin does not provide a cured product having sufficient characteristics. For solving such a problem, for example, JP 11-263827 A discloses the study of a chlorine-free alicyclic epoxy resin having excellent cationic curability. In JP 11-263827 A, however, the alicyclic epoxy resin used contains ester bonds, and a cationic curing rate is not sufficient. Furthermore, ester bonds are cleaved by a cationic component generated in curing to generate carboxylic acids, leading to large problems of an increase in water absorption of a cured product, a decrease in a glass-transition temperature (Tg) thereof, and so on.

Furthermore, an epoxy resin to be industrially used is generally obtained from a reaction between a phenol compound and epichlorohydrin (ECH). A glycidyl compound generated in a production process contains chemically-bonded chlorine in a content of several percent depending on the process conditions. However, a chlorine-free epoxy resin has been needed in terms of environmental and safety problems, for example. In the use thereof for electronic materials, in particular, hydrolytic chlorine atoms in an epoxy resin have been regarded as a problem because these chlorine atoms are ionized to cause lowering of reliability such as corrosion of wiring or the like and decrease in insulating property. Therefore, various studies have been made to decrease a content of hydrolytic chlorine atoms in the epoxy resin to free the chlorine atoms. In spite of such efforts, the total chlorine content of the resulting epoxy resin is about several hundreds ppm. Additional purification is needed for further reducing the chlorine content, resulting in a very expensive product.

It is an object of the present invention to provide a non-ester type epoxy resin having a low hydrolytic chlorine content and containing no ester bonds that are easily hydrolyzed. According to the present invention, the non-ester type epoxy resin can be realized by means which can be easily changed through adjustment of process parameters and selection of appropriate starting compounds. In other words, the present invention is characterized in that a non-ester type epoxy resin containing no hydrolytic chlorine atoms can be readily provided at low cost.

SUMMARY OF THE INVENTION

That is, a first aspect of the present invention provides a non-ester type alicyclic epoxy resin, manufactured through a reaction between a non-ester type alicyclic epoxy compound and a phenol compound. A second aspect of the present invention provides a non-ester type alicyclic epoxy resin according to the first aspect, in which the non-ester type alicyclic epoxy compound is represented by general formula (I):

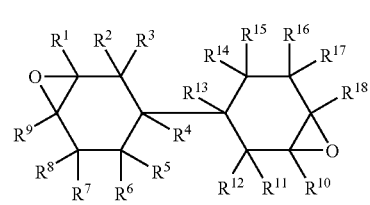

(I)

(wherein, each of $R^1$ to $R^{18}$ may be identical to or different from each other, and is a hydrogen atom, a halogen atom except a chlorine atom, a hydrocarbon group which may contain an oxygen atom or a halogen atom except a chlorine atom, or an alkoxy group which may have a substituted group).

A third aspect of the present invention provides a non-ester type alicyclic epoxy resin according to the first aspect, in which the non-ester type alicyclic epoxy compound is represented by general formula (III):

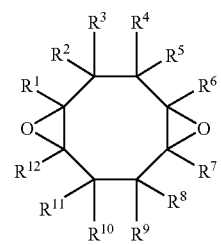

(III)

(wherein, each of $R^1$ to $R^{12}$ may be identical to or different from each other, and is a hydrogen atom, a halogen atom except a chlorine atom, a hydrocarbon group which may contain an oxygen atom or a halogen atom except a chlorine atom, or an alkoxy group which may have a substituted group).

A fourth aspect of the present invention provides a non-ester type alicyclic epoxy resin according to the first aspect, in which the non-ester type alicyclic epoxy compound is represented by general formula (V):

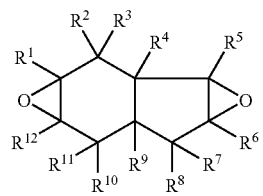

(V)

(wherein, each of $R^1$ to $R^{12}$ may be identical to or different from each other, and is a hydrogen atom, a halogen atom except a chlorine atom, a hydrocarbon group which may contain an oxygen atom or a halogen atom except a chlorine atom, or an alkoxy group which may have a substituted group).

A fifth aspect of the present invention provides a non-ester type alicyclic epoxy resin according to any one of the first to fourth aspects, in which the phenol compound has a hydroxyl group bonded through an aliphatic chain. A sixth aspect of the present invention provides a non-ester type alicyclic epoxy resin according to the fifth aspect, in which the phenol compound having a hydroxyl group bonded through an aliphatic chain is at least one of bisphenol and bisphenol and contains a 1:2 adduct with the non-ester type alicyclic epoxy compound.

A seventh aspect of the present invention provides a resin composition including the non-ester type alicyclic epoxy resin according to any one of the first to sixth aspects, and at least one of a photo acid generator (photo-cationic polymerization initiator) and/or a thermal cationic polymerization initiator. An eighth aspect of the present invention provides a resin composition according the seventh aspect, which is used as one of a covering agent and an encapsulate or a transparent encapsulate for an electronics device. A ninth aspect of the present invention provides a resin composition according the seventh aspect, which is used as any one of a molding material and a material for a printed circuit board. A tenth aspect of the present invention provides a resin composition according to the seventh aspect, which is used as an adhesive.

DETAILED DESCRIPTION OF THE INVENTION

The above object can be attained by reacting a non-ester type alicyclic epoxy compound having a specific structure with a phenol compound. In this case, a molecular weight of a resulting resin can be adjusted by changing a molar ratio of starting compounds and the numbers of functional groups of the two respective starting compounds each showing reactivity in an addition reaction.

The term "non-ester type alicyclic epoxy compound having a specific structure" means each of compounds exemplified below.

The non-ester alicyclic epoxy compound of the general formula (I) is manufactured through oxidation of an unsaturated compound represented by the general formula (II) having a bicyclo hexyl-3,3'-diene skeleton with an organic per carboxylic acid such as peracetic acid or a hydrogen peroxide solution (see, e.g., Japanese Patent Publication No. 2004-099467).

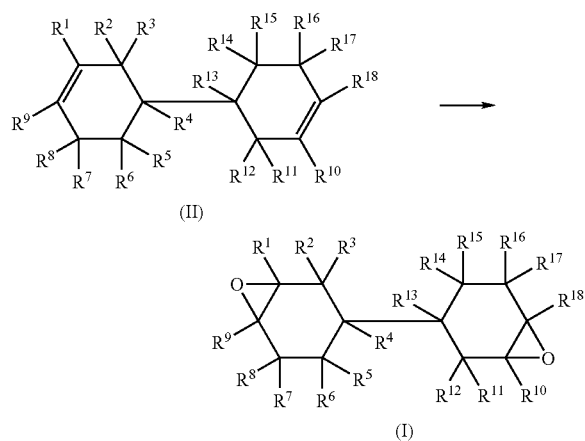

(II)

(I)

In the general formulae (I) and (II), each of $R^1$ to $R^{18}$ may be identical to or different from each other, and is a hydrogen atom, a halogen atom except a chlorine atom, a hydrocarbon group which may contain an oxygen atom or a halogen atom except a chlorine atom, or an alkoxy group which may have a substituted group.

The epoxy compound represented by the general formula (III) is manufactured through oxidation of an unsaturated compound represented by the general formula (IV) having a cyclo octadiene skeleton with an organic per carboxylic acid such as peracetic acid or a hydrogen peroxide solution (see, e.g., Japanese Patent Publication No. 2004-262874).

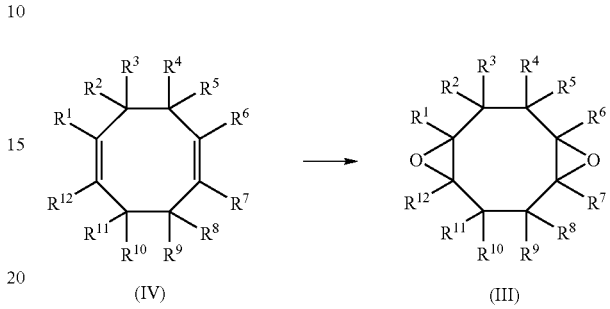

(IV)

(III)

In the general formulae (III) and (IV), each of $R^1$ to $R^{12}$ may be identical to or different from each other, and is a hydrogen atom, a halogen atom except a chlorine atom, a hydrocarbon group which may contain an oxygen atom or a halogen atom except a chlorine atom, or an alkoxy group which may have a substituted group.

The epoxy compound represented by the general formula (V) is manufactured through oxidation of an unsaturated compound represented by the general formula (VI) having an alicyclic indent skeleton with an organic per carboxylic acid such as peracetic acid or a hydrogen peroxide solution (see, e.g., Japanese Patent Publication No. 2004-182648).

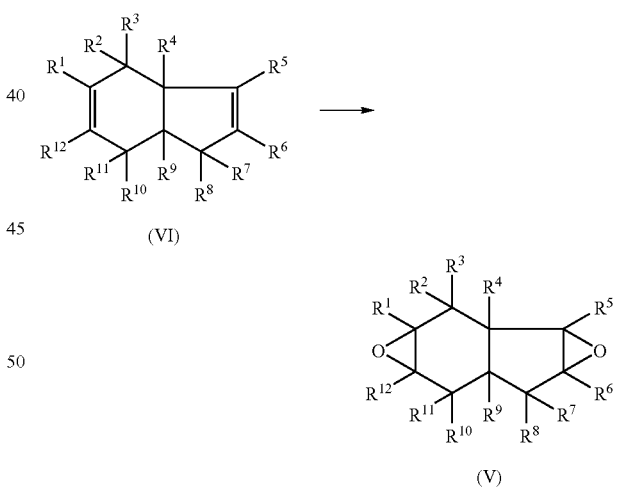

(VI)

(V)

In the general formulae (V) and (VI), each of $R^1$ to $R^{12}$ may be identical to or different from each other, and is a hydrogen atom, a halogen atom except a chlorine atom, a hydrocarbon group which may contain an oxygen atom or a halogen atom except a chlorine atom, or an alkoxy group which may have a substituted group.

In the general formulae (I) to (VI), each of the hydrocarbon group and the alkoxy group has preferably 1 to 5 carbon atoms.

Each of the above unsaturated compounds (II), (IV), and (VI) is preferably oxidized with an organic per carboxylic acid having a low moisture content, in particular, 2% by weight or less (preferably 0.8% by weight or less) in terms of producing the above epoxy compounds (I), (III), and (V) each having a high oxidase oxygen concentration (see, e.g., each of the Publications described above).

Examples of the phenol compound used in the present invention include various kinds of phenol compounds represented by the general formulae (1) to (6) described below, in particular, bisphenols, bisphenols such as bisphenol A, bisphenol F, bisphenol S, fluorine-containing bisphenol A, and fluorine-containing bisphenol F, and naphthalene diol.

A substituted monophenol compound such as nonylphenol, 1,5-naphthalene diol represented by the formula (1), or p-nonylphenol is preferable for adjusting the molecular weight of the resin.

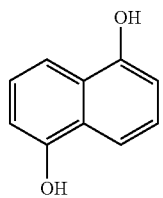

Formula (1)

Alternatively, an example of the phenol compound that can be used includes a phenol compound containing a substituted group having a hydroxyl group bonded to an aliphatic chain, such as:

4-hydroxy-benzyl alcohol represented by the formula (2);

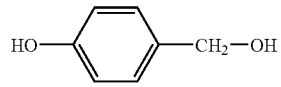

Formula (2)

2-hydroxy-benzyl alcohol represented by the formula (3);

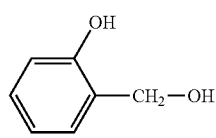

Formula (3)

4-hydroxy-3-methoxy-benzyl alcohol represented by the formula (4);

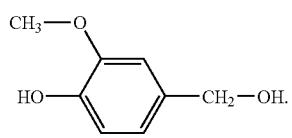

Formula (4)

Other examples thereof include polynuclear phenol compounds such as ethylidene triphenols [formula (5)], ethane diligence tetrakis phenols [formula (6)], and novolak type phenols when the non-ester alicyclic epoxy compound is in an excess amount.

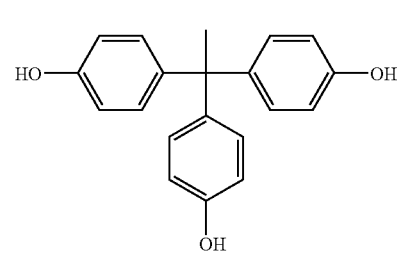

Formula (5)

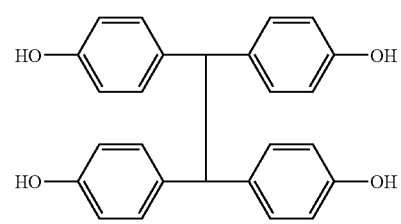

Formula (6)

Other examples of the polynuclear phenol compounds that can be used include novolak phenols.

As the above phenol compounds, there may be employed simple derivatives and homologs of the respective examples, which can be obtained by elongation of alkyl chains, substitution of protons with alkyl groups, and so on. The above phenol compounds may be used in combination with any of other phenol compounds.

In the reaction between the non-ester type alicyclic epoxy compound and the phenol compound, a catalyst may be used. Examples of the catalyst include: tertiary amines such as dimethylbenzylamine, triethylamine, tetramethylethylenediamine, and tri-n-octylamine; quaternary ammonium salts such as tetraethylammonium chloride, tetraethylammonium bromide, and tetrabutylammonium bromide; alkyl ureas such as tetramethyl urea; alkyl guanidines such as tetramethyl guanidine; metal compounds typified by cobalt naphthenate; organic metal complexes; phosphines such as triphenylphosphine; and salts thereof. Of those, tertiary phosphines typified by triphenylphosphine are preferable. The above catalyst may be used solely or in combination with other catalysts. The catalyst is used in a content of 0.01 to 10% by weight, preferably 0.5 to 3.0% by weight with respect to that of the epoxy compound. A catalyst content of less than 0.01% by weight provides a small catalytic effect. On the other hand, there is no need to add more than 10% by weight of the catalyst.

The reaction between the non-ester type alicyclic epoxy compound and the phenol compound is carried out at a molar ratio "m/n" (the epoxy group in the epoxy compound: the hydroxyl group in the phenol compound)=1 to 20, preferably 1.1 to 10 ["m" means the number of moles of the epoxy group and "n" means the number of moles of the hydroxyl group]. For another polyfunctional phenol compound, the above ratio may be varied. However, a phenolic hydroxyl group is preferably consumed completely after the reaction by constantly using an excess amount of the epoxy resin.

If the molar ratio of (the epoxy group in the epoxy compound:the hydroxyl group in the phenol compound) is less than 1, the resin loses its cationic curability because the epoxy group disappears almost completely. If the molar ratio thereof exceeds 20, a modification degree of the resin by the phenol compound is low and the characteristic of the non-ester type alicyclic epoxy resin of the present invention cannot be exerted. Therefore, a molar ratio falling out of the above range is not preferable. The non-ester type epoxy resin of the present invention to be obtained is a mixture of a reaction product of the non-ester type aliphatic epoxy compound with the phenol compound, and the non-ester type aliphatic epoxy compound. Hereinafter, the non-ester type epoxy resin of the present invention to be obtained will be referred to as an epoxy resin for convenience. The non-ester type epoxy resin of the present invention to be obtained has an epoxy equivalent of 100 to 3,000, preferably 150 to 1,000, more preferably 200 to 1,000.

A reaction temperature is 100 to 250° C., preferably 100 to 180° C. If the reaction temperature is lower than 100° C., the reaction is slow. If the reaction temperature exceeds 180° C., the desired epoxy resin cannot be obtained because a side reaction occurs. The reaction is preferably carried out while nitrogen gas is blown into a gas phase part from a viewpoint of safeness.

A solvent can be used in the reaction between the non-ester type alicyclic epoxy compound and phenol compound. The solvent is not particularly limited as long as it can dissolve raw materials used. Examples of the solvent include: aromatic hydrocarbons such as benzene, toluene, and xylene; alcohols such as methanol, ethanol, and 2-propanol; ketones such as acetone, methyl ethyl ketone, and methyl isobutyl ketone; ethers such as diethyl ether, dibutyl ether, and dioxane; esters such as ethyl acetate, isobutyl acetate, ethylene glycol monoacetate, propylene glycol monoacetate, and dipropylene glycol monoacetate; ethylene glycol monoalkyl ethers; diethylene glycol monoalkyl ethers; propylene glycol monoalkyl ethers; dipropylene glycol monoalkyl ethers; butylene glycol monoalkyl ethers; ethylene glycol dialkyl ethers; diethylene glycol dialkyl ethers such as diethylene glycol dimethyl ether and diethylene glycol diethyl ether; ethylene glycol monoalkyl ether acetates; diethylene glycol monoalkyl ether acetates; amides such as dimethylformamide and dimethylacetamide; and halogenated hydrocarbons such as carbon tetrachloride and chloroform. The solvent may be used solely or in combination with other solvents.

Furthermore, the solvent used may be a reactive compound including a compound having a radical polymerizable double bond typified by an acrylic ester or methacrylic ester compound, a vinyl aromatic compound such as styrene, or an amide-based unsaturated compound. The compound having a radical polymerizable double bond serves as a curable component in the resin composition, and the compound is preferable because there is no need to volatilized the solvent after application of the composition. The amount of the solvent used is 0 to 1,000 parts by weight, preferably about 0 to 500 parts by weight with respect to 100 parts by weight of the sum of the non-ester type alicyclic epoxy compound and the phenol compound provided as the starting materials.

The resin composition of the present invention includes the non-ester type epoxy resin of the present invention and a photo acid generator. Furthermore, the resin composition of the present invention may be prepared by mixing with an additional epoxy resin or the like, if required.

Examples of the photo acid generator and/or thermal cationic polymerization initiator are as follows.

Examples of the photo acid generator include sulfonium salt-based, iodonium salt-based, diazonium salt-based, and alkene-ion complex-based compounds. Examples of the sulfonium salt-based compound include: UNCURED 1590 and UNCURED 1591 (manufactured by Daniel UCB Co., Ltd.); DAICAT11 (manufactured by Daniel Chemical Industries, Ltd.); CD-1011 (manufactured by Sartomer Company Inc.); and SI-60L, SI-80L, and SI-100L (manufactured by Sanshin Chemical Industry Co., Ltd.). Examples of the iodonium salt-based compound include: DAICAT12 (manufactured by Daniel Chemical Industries, Ltd.); and CD-1012 (manufactured by Sartomer Company Inc.). Examples of the diazonium salt-based compound include SP-150 and SP-170 (manufactured by Asahi Denka Co., Ltd.). Of the photo acid generators, the above SI-60L, SI-80L, and SI-100L can generate cations also by heating.

Furthermore, examples of the thermal cationic polymerization initiator that can also be used include a silanol-based cationic catalyst such as triphenylsilanol, and an aluminum chelate-based catalyst such as aluminum tris(acetylacetone).

In the present invention, the above cationic polymerization initiator may be mixed at a content of about 0.01 to 20 parts by weight, preferably about 0.1 to 5 parts by weight, more preferably about 0.1 to 3 parts by weight with respect to 100 parts by weight of the sum of the non-ester type epoxy resin and any of other optionally added epoxy resins described below. If the cationic polymerization initiator is mixed in a content of 0.01 part by weight or less, the heat curability deteriorates significantly. On the other hand, the cationic polymerization initiator mixed in a content of 20 parts by weight or more is uneconomical because no effect of increase in content is exerted and physical properties of the cured product deteriorate. Thus, both cases are not preferable.

Furthermore, examples of a curing accelerator that may be used in curing include: an amidine compound such as 1,8-diazabicyclo (5,4,0) undecene (DBU); an organic phosphorus compound such as triphenylphosphine, tetraphenylphosphonium, or tetraphenylborate; and an imidazole compound such as 2-methylimidazole. However, the curing accelerator is not limited to these compounds. The curing accelerator may be used solely or in combination with other curing accelerators. The mixing amount thereof is preferably in the range of 0.4 to 20 parts by weight with respect to 100 parts by weight of the sum of the alicyclic epoxy resin, other optionally added epoxy resins described below, and the polymerization initiator. If the mixing amount is less than 0.4 part by weight, sufficient curing may not be obtained through heat molding. On the other hand, if the mixing amount exceeds 20 parts by weight, the curing becomes too fast to possibly cause poor filling as a result of decrease in fluidity during molding. Thus, both cases are not preferable.

In the resin composition of the present invention, other resins optionally added to the non-ester type epoxy resin are not particularly limited. Examples thereof include bifunctional epoxy resins selected from a bisphenol A type epoxy resin, a bisphenol F type epoxy resin, a bisphenol S type epoxy resin, a bisphenol AD type epoxy resin, a naphthalene type epoxy resin, and a biphenyl type epoxy resin. The bifunctional epoxy resins each having a low chlorine content and containing no ester bond are particularly preferable.

Additional examples thereof include: novolak epoxy resins such as a phenol novolak type epoxy resin, a bromophenol novolak type epoxy resin, an orthocresol novolak type epoxy resin, a bisphenol A novolak type epoxy resin, and a bisphenol AD novolak type epoxy resin; alicyclic epoxy resins such as an epoxy resin having a tricyclodecene oxide group, and an epoxide of a dicyclopentadiene type phenol resin; aromatic epoxy resins such as an epoxide of a naphthalene type phenol resin; glycidyl ester type epoxy resins such as dimer acid glycidyl ester and triglycidyl ester; glycidylamine type epoxy resins such as tetraglycidyl aminodiphenylmethane, triglycidyl-p-amoniphenol, triglycidyl-p-amoniphenol, tetraglycidyl methaxylylene diamine, and tetraglycidyl bisaminomethylcyclohexane; heterocyclic epoxy resins such as triglycidyl isocyanurate; trifunctional epoxy resins such as phloroglucinol triglycidyl ether, trihydroxybiphenyl triglycidyl ether, trihydroxyphenylmethane triglycidyl ether, glycerin triglycidyl ether, 2-[4-(2,3-epoxypropoxy)phenyl]-2-[4-[1,1-bis[4-(2,3-epoxypropoxy)phenyl]ethyl]phenyl]propane, and 1,3-bis[4-[1-[4-(2,3-epoxypropoxy)]phenyl]-1-[4-[1-[4-(2,3-epoxypropoxy)phenyl]-1-methylethyl]phenyl]ethyl]phenoxy]-2-propanol; tetrafunctional epoxy resins such as tetrahydroxyphenylethane tetraglycidyl ether, tetraglycidyl benzophenone, bisresorcinol tetraglycidyl ether, and tetraglycidoxy biphenyl; and alicyclic epoxy resins such as 3,4-epoxy cyclohexenylmethyl-3',4'-epoxy cyclohexenyl carboxylate (Celloxide 2021P manufactured by Daniel Chemical Industries, Ltd.), limonene diepoxide (Celloxide 3000 manufactured by Daniel Chemical Industries, Ltd.), bis(3,4-epoxy cyclohexylmethyl)adipate (such as ERL4227 manufactured by Union Carbide Corporation), epoxidized 3-cyclohexane-1,2-dicarboxylic acid bis 3-cyclohexenyl methyl ester and an $\epsilon$-caprolactone adduct thereof (GT300 series such as "Epolead GT301" manufactured by Daniel Chemical Industries, Ltd.), and epoxidized butanetetracarboxylic acid tetrakis-3-cyclohexenyl methyl ester and an $\epsilon$-caprolactone adduct thereof (GT400 series such as "Epolead GT401" manufactured by Daniel Chemical Industries, Ltd.). The addition amount of the other optionally added epoxy resins is 1 to 1,000 parts by weight, preferably 20 to 500 parts by weight, more preferably 50 to 300 parts by weight with respect to 100 parts by weight of the non-ester type epoxy resins of the present invention. If the addition amount thereof is less than 1 part by weight, it is meaningless to add the other epoxy resins to be optionally added. If the addition amount thereof is more than 1,000 parts by weight, excellent characteristics by the non-ester type epoxy resin of the present invention are not shown in the cured products. Of the other epoxy resins, alicyclic epoxy resins are particularly preferable.

The resin composition of the present invention can be cured by irradiation of light such as active energy rays including ultraviolet (UV) rays and electron beams, or by heating. The resin may be cured by light irradiation, and then further subjected to heat curing.

Examples of a light source for UV irradiation include a high pressure mercury lamp, an ultra-high pressure mercury lamp, a carbon-arc lamp, a xenon lamp, and a metal halide lamp. An exposing time may be several ten seconds at longest and several seconds in general, and may vary depending on the type of the light source, a distance between the light source and an application surface, and other conditions. After UV irradiation, the resin may be cured more completely by heat, if required. For electron beam irradiation, the electron beam used preferably has an energy of 50 to 1,000 KeV with an exposing dose of 2 to 5 Mrad. In general, the light source used has a lamp output of about 80 to 300 W/cm.

For curing the resin composition of the present invention by heat, the resin composition is heated at a temperature of 30 to 240° C., preferably 35 to 200° C., more preferably 35 to 180° C., for a curing time of 0.1 to 300 minutes, preferably 0.1 to 240 minutes, more preferably 0.5 to 120 minutes.

If the curing temperature and curing time are lower than the lower limits of the above ranges, the resin composition may not be cured sufficiently. On the other hand, if the curing temperature and the curing time are higher than the upper limits of the above ranges, the resin component may be decomposed. Therefore, both cases are not preferable.

The curing conditions depend on various conditions and may be arbitrarily adjusted. If the curing temperature is high, the curing time may be shortened, and if the curing temperature is low, the curing time may be prolonged. In general, the resin composition is subjected to primary curing (at a curing temperature of 5 to 240° C., preferably 15 to 100° C., more preferably 15 to 70° C., for a curing time of 1 to 300 minutes, preferably 15 to 240 minutes, more preferably 60 to 120 minutes) and then to secondary curing (at a curing temperature of 60 to 240° C., preferably 90 to 200° C., more preferably 120 to 200° C., for a curing time of 0.1 to 180 minutes, preferably 45 to 150 minutes, more preferably 60 to 120 minutes), to thereby prevent insufficient curing.

The resin composition of the present invention is useful for a paint, a coating agent, an adhesive, a covering agent, an encapsulate or a transparent encapsulate, a plastic panel, or the like and may also be used for a resist ink or the like. The resin composition of the present invention may contain any of other additives, if required, such as an agent producible an acid by photo irradiation, acid anhydrides, thermal polymerization inhibitors, surfactants, light absorbents, thixotropy-imparting agents, dyes, and pigments. Furthermore, the resin composition of the present invention may further contain a thermoplastic resin, a thermosetting resin, or the like.

The above components may be sufficiently mixed with a mixing device generally used in the art, such as a mixer (e.g., blender). Subsequently, the mixture is subjected to melt-kneading using a heated roll, a kneader, or the like, cooled, and then pulverized, to thereby provide a molding material. Furthermore, for encapsulating electronic parts such as semiconductor elements to produce a semiconductor device, encapsulation may be carried out through a molding process such as transfer molding, compression molding, or injection molding.

The resin composition of the present invention can be cured as a thin film adhered onto a substrate. Examples of methods of forming such a thin film include spraying, brushing, roll coating, curtain coating, electrodeposition coating, and electrostatic coating. The curing is preferably carried out under inert gas atmosphere. Alternatively, the curing may be also be carried out under air atmosphere. The non-ester type epoxy resin and resin composition of the present invention are applicable to numerous industrial fields including: various coating fields such as ink, plastic coating, paper printing, film coating, and furniture coating; FRP; lining; and an insulating varnish in electronics fields, an insulating sheet, a laminate sheet, a printed circuit board, a resist ink, a resist ink for color filter pigments, an encapsulate for semiconductors, a transparent encapsulate, and plastic panels.

EXAMPLES

Hereinafter, the present invention will be specifically explained with reference to examples, but the present invention is not limited thereto.

<Synthesis of Non-Ester Type Alicyclic Epoxy Compound>

Preparation Example 1

406 g of bicyclo hexyl-3,3'-diene as an alicyclic olefin compound represented by the general formula (II) was introduced into a reaction system together with 1,217 g of ethyl acetate. Then, 475 g of an ethyl acetate solution (moisture percentage of 0.41%) containing 30% by weight of peracetic acid was dropped into the reaction system over about 3 hours while blowing nitrogen into a gas phase part and the inside of the reaction system was kept at a temperature of 37.5° C. After completing the dropping of the peracetic acid solution, the reaction mixture was matured at 40° C. for 1 hour to complete the reaction. A resulting crude solution obtained at the completion of the reaction was washed with water at 30° C. and then a low-boiling compound was removed at 70° C./20 mmHg, resulting in 415 g of an epoxy compound. At this time, the yield was 85%.

The resulting epoxy compound had an oxidase oxygen concentration of 14.7% by weight.

Furthermore, the epoxy compound was subjected to an $^1$H-NMR measurement, and disappearance of a peak derived from an internal double bond in the vicinity of $\delta 5.6$ to 5.8 ppm and generation of a peak of a proton derived from an epoxy group in the vicinity of $\delta 3.1$ to 3.3 ppm were observed. Thus, the results confirmed that the above epoxy compound was a non-ester type alicyclic epoxy compound represented by the general formula (I). Hereinafter, the alicyclic epoxy compound is referred to as (A-1).

Preparation Example 2

108 g of cyclo octadiene as an alicyclic olefin compound represented by the general formula (IV) was introduced into a reaction system together with 108 g of ethyl acetate. Then, 532 g of an ethyl acetate solution (moisture percentage of 0.41% by weight) containing 30% by weight of peracetic acid was dropped into the reaction system over about 3 hours while blowing nitrogen into a gas phase part and the inside of the reaction system was kept at a temperature of 30° C. After completing the dropping of the peracetic acid solution, the reaction mixture was matured at 30° C. for 5 hours to complete the reaction.

86.9 g of sodium carbonate was added to a resulting crude solution obtained at the completion of the reaction while stirring the solution at 20° C. or lower for half-neutralization. Subsequently, 219 g of a 10% NaOH aqueous solution was added and then the stirring was terminated to allow the mixture to separate into two layers, followed by removing a lower water layer. Such a step was repeated three times, and then the remaining neutralized salt was removed from an upper organic layer by twice washing with 250 g of distilled water.

From the washed crude solution, low-boiling compounds were removed at 60° C./20 mmHg, resulting in 112.3 g of an epoxy compound. At this time, the yield was 80.2%. In addition, the resulting epoxy compound was subjected to an $^1$H-NMR measurement, and disappearance of a peak derived from an internal double bond in the vicinity of $\delta 5.5$ to 5.7 ppm and generation of a peak of a proton derived from an epoxy group in the vicinity of $\delta 2.9$ to 3.1 ppm were observed. Thus, the results confirmed that the above epoxy compound was a non-ester type alicyclic epoxy compound represented by the general formula (III). Hereinafter, the alicyclic epoxy compound is referred to as (A-2).

Preparation Example 3

240 g of tetrahydroindene as an alicyclic olefin compound represented by the general formula (VI) was introduced into a reaction system together with 480 g of ethyl acetate. Then, 1,220 g of an ethyl acetate solution (moisture percentage of 0.41%) containing 30% by weight of peracetic acid was dropped into the reaction system in about 3 hours while blowing nitrogen into a gas phase part and the inside of the reaction system was kept at a temperature of 30° C. After completing the dropping of the peracetic acid solution, the reaction mixture was matured at 30° C. for 6 hours to complete the reaction. 398 g of sodium carbonate was added to the resulting crude solution obtained at the completion of the reaction while stirring the solution at 20° C. or lower for half-neutralization. Subsequently, 1,500 g of a 10% NaOH aqueous solution was added, and then the stirring was terminated to allow the mixture to separate into two layers, followed by removing a lower water layer. Then, the remaining neutralized salt was removed from an upper organic layer by washing with 1,000 g of distilled water.

From the washed crude solution, low-boiling compounds were removed at 40° C./10 mmHg, resulting in 243 g of an epoxy compound. At this time, the yield was 80%. In addition, the resulting epoxy compound was subjected to an $^1$H-NMR measurement, and disappearance of peaks derived from internal double bonds in the vicinity of $\delta 5.5$ to 5.7 and 5.8 to 6.0 ppm and generation of a peak of a proton derived from an epoxy group in the vicinity of $\delta 3.0$ to 3.5 ppm were observed. Thus, the results confirmed that the above epoxy compound was a non-ester type alicyclic epoxy compound represented by the general formula (V). Hereinafter, the alicyclic epoxy compound is referred to as (A-3).

<Synthesis of Non-Ester Type Epoxy Resin and Epoxy Resin for Comparison>

Examples 1 to 5 and Comparative Examples 1 and 2

Into a five-necked flask equipped with a nitrogen introduction pipe, a thermometer, a cooling pipe, and a stirring device, the epoxy compounds (A-1) to (A-3) obtained in Examples 1 to 3 and bisphenol A were introduced in concentrations (in parts by weight) shown in Table 1 described below, respectively. Then, the reaction mixture was heated to 120° C. to melt, followed by introduction of 0.05 part by weight of triphenylphosphine. Subsequently, the reaction temperature was risen to 150° C. to carry out a reaction for 3 hours, to thereby synthesize both non-ester type epoxy resins and epoxy resins for comparison.

Solid epoxy resins having molecular weights and epoxy equivalents shown in Table 1 described below were obtained, respectively. The resulting epoxy resins are referred to as (A-4) to (A-10), respectively.

TABLE 1

|  | Example 1 A-4 | Example 2 A-5 | Example 3 A-6 | Example 4 A-7 | Example 5 A-8 | Comparative Example 1 A-9 | Comparative Example 2 A-10 |
| --- | --- | --- | --- | --- | --- | --- | --- |
| (A-1) | 258 |  |  | 305 | 378 |  |  |
| (A-2) |  | 227 |  |  |  |  |  |

TABLE 1-continued

| | Example 1 A-4 | Example 2 A-5 | Example 3 A-6 | Example 4 A-7 | Example 5 A-8 | Comparative Example 1 A-9 | Comparative Example 2 A-10 |
|---|---|---|---|---|---|---|---|
| (A-3) | | | 217 | | | | |
| Epicoat 828 | | | | | | 333 | |
| CEL2021P | | | | | | | 290 |
| Bisphenol A | 242 | 273 | 283 | | 123 | 167 | 210 |
| Biphenol | | | | 195 | | | |
| Epoxy equivalent | 980 | 830 | 800 | 945 | 200 | 1,020 | 1,080 |
| Molecular weight | 1,980 | 1,770 | 1,710 | 2,000 | 840 | 2,200 | 2,300 |

Epicoat 828: diglycidyl ether of bisphenol A manufactured by Japan Epoxy Resin Co., Ltd.
CEL2021P: 3,4-epoxycyclohexylmethyl-(3,4-epoxy)cyclohexane carboxylate, manufactured by Daicel Chemical Industries, Ltd.
Biphenol: Biphenol, manufactured by Honshu Chemical Industry Co., Ltd.

Application Examples 1 to 5 and Comparative Application Examples 1 and 2

After 50 parts by weight of each of the epoxy resins obtained in Examples 1 to 5 and Comparative Examples 1 and 2 described above was mixed with 50 parts by weight of CEL2021P at 60° C., predetermined amounts of L-7604 as an antifoaming agent and UNCURED 1591 as an agent producible an acid by photo irradiation were added to the reaction mixture, to thereby prepare a UV-curable resin composition. Table 2 shows the mixing compositions and the evaluation results of the application examples and the comparative application examples, respectively.

Preparation of cured films: Each of the resin compositions obtained in the application examples and the comparative application examples was applied onto a polyethylene terephthalate (PET) film of 0.50 mm in thickness to provide a coating film of 30 μm in thickness after having been cured. Subsequently, cured conditions of the resulting coating film were checked after UV irradiation with a high pressure mercury lamp (120 W/cm), at a distance of 15 cm from a coating plate, and at an energy radiation dose of 50 to 500 mJ/cm$^2$.

After each of the UV-curable resin compositions was applied onto a glass substrate of 0.50 mm in thickness, onto which a mold-releasing agent was applied, the resin composition was cured at 500 mJ/cm$^2$ and then cured under heating at 40° C. for 24 hours, to thereby prepare a cured film of 30 μm in thickness. The cured film was placed into a pressure cooker test (PCT) device and then compared with other films in terms of hydrolysis rates on the basis of measurements on the water absorption and the acid value of the cured film.

TABLE 2

| | Application Example 1 | Application Example 2 | Application Example 3 | Application Example 4 | Application Example 5 | Comparative Application Example 1 | Comparative Application Example 2 |
|---|---|---|---|---|---|---|---|
| A-4 | 50 | | | | | | |
| A-5 | | 50 | | | | | |
| A-6 | | | 50 | | | | |
| A-7 | | | | 50 | | | |
| A-8 | | | | | 100 | | |
| A-9 | | | | | | 50 | |
| A-10 | | | | | | | 50 |
| CEL2021P | 50 | 50 | 50 | 50 | | 50 | 50 |
| L-7604 | 0.3 | 0.3 | 0.3 | 0.3 | 0.3 | 0.3 | 0.3 |
| UVACURE 1519 | 3 | 3 | 3 | 3 | 3 | 3 | 3 |
| Evaluation Results | | | | | | | |
| Cationic curing rate (Exposing dose) (mJ/um2) | 300 | 250 | 300 | 250 | 200 | 700 | 500 |
| Water absorption (%) | 2.4 | 2.7 | 2.9 | 3.1 | 1.5 | 3 | 5.5 |
| Acid value (KOH-mg/g) | 2.4 | 2.6 | 2.7 | 2.6 | 1.9 | 2.5 | 15.4 |
| Chlorine concentration (ppm) | 3.2 | 4.2 | 5.6 | 3.9 | 3.3 | 1,200 | 3.4 |

L-7604: (Antifoaming agent; manufactured by Nippon Unicar Co., Ltd.)

(1) Cationic Curing Rate

An exposing dose was changed within the range of 50 to 500 mJ/cm$^2$ to compare the cationic curing rate from the exposing dose for making the coating film surface tack-free.

(2) Water Absorption and Acid Value (Comparison of Hydrolysis Rates)

(i) A cured film was placed into a pressurized vessel of 121° C. in temperature and 95% in humidity (i.e., under air atmosphere), followed by taking out the cured film after 96 hours, to thereby measure the water absorption of the cured film on the basis of a change in weight.

(ii) The cured film peeled off from a glass substrate was finely pulverized, and then the acid value of the cured film was measured.

(3) Chlorine Analysis

The chlorine content in each of the epoxy resin compositions was determined through elemental analysis.

What is claimed is:

1. An alicyclic epoxy resin containing no ester bonds, manufactured through a reaction between an alicylic epoxy compound represented by general formula (I) and a phenol compound, wherein the general formula (I) is as follows:

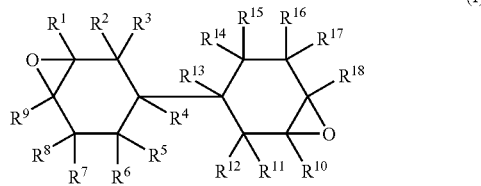

wherein, each of $R^1$ to $R^{18}$ is identical to or different from each other, and is a hydrogen atom, a halogen atom except a chlorine atom, a hydrocarbon group which optionally contains an oxygen atom or a halogen atom except a chlorine atom, or an alkoxy group which optionally contains a substituted group.

2. An alicyclic epoxy resin containing no ester bonds according to claim 1, Wherein the phenol compound has a hydroxyl group bonded through an aliphatic chain.

3. An alicyclic epoxy resin containing no ester bonds according to claim 2, wherein the phenol compound having a hydroxyl group bonded through an aliphatic chain is at least one of bisphenol and bisphenol and contains a 1:2 adduct with the alicyclic epoxy compound.

4. A resin composition, comprising:
   an alicyclic epoxy resin containing no ester bonds according to any one of claims 1, 2 and 3, and
   at least one of a photo-acid generator (photo-cationic polymerization initiator) and/or a thermal cationic polymerization initiator.

5. A resin composition according claim 4, which is one of a coating agent and an encapsulate or a transparent encapsulate for an electronics device.

6. A resin composition according claim 4, which is any one of a molding material and a material for a printed circuit board.

7. A resin composition according to claim 4, which is an adhesive.

* * * * *